United States Patent [19]

Fukuda et al.

[11] Patent Number: 4,458,348
[45] Date of Patent: Jul. 3, 1984

[54] ELECTRICALLY PROGRAMMABLE READ ONLY MEMORY HAVING REDUCED LEAKAGE CURRENT

[75] Inventors: Minoru Fukuda, Tokyo; Shigeru Yamatani, Fuchu; Kotaro Nishimura, Kodaira; Akira Endo, Hachioji, all of Japan

[73] Assignee: Hitachi, Ltd., Tokyo, Japan

[21] Appl. No.: 380,775

[22] Filed: May 21, 1982

[30] Foreign Application Priority Data

May 22, 1981 [JP] Japan ................. 56-76519

[51] Int. Cl.$^3$ .................. G11C 7/00; G11C 11/40
[52] U.S. Cl. ..................... 365/185; 365/189
[58] Field of Search ............ 365/184, 185, 189

[56] References Cited

U.S. PATENT DOCUMENTS

| 4,063,224 | 12/1977 | Kirschner | 365/184 |
| 4,366,555 | 12/1982 | Hu | 365/185 |
| 4,415,993 | 11/1983 | Smith et al. | 365/184 |

FOREIGN PATENT DOCUMENTS

| 2844955 | 4/1979 | Fed. Rep. of Germany . | |
| 2409472 | 12/1980 | Fed. Rep. of Germany . | |
| 3037315 | 4/1981 | Fed. Rep. of Germany . | |
| 3124283 | 6/1982 | Fed. Rep. of Germany . | |
| 54-152932 | 12/1979 | Japan | 365/185 |
| 1547183 | 6/1979 | United Kingdom . | |
| 1593554 | 7/1981 | United Kingdom . | |

OTHER PUBLICATIONS

Grice et al., "Electrically Programmable Logic Array", IBM Tech. Disc. Bul., vol. 22, No. 10, 3/80, pp. 4621–4622.

Primary Examiner—Stuart N. Hecker
Attorney, Agent, or Firm—Antonelli, Terry & Wands

[57] ABSTRACT

An electrically programmable read only memory includes a plurality of non-volatile memory elements having control gates which are commonly connected to a first word line and drains which are coupled to a write-down circuit for supplying a write-down voltage to said drains. To prevent the flow of leakage current caused by parasitic capacitance, at least one of source electrodes of the plurality of non-volatile memory elements is connected to ground potential through the drain-source path of a first switch MISFET whose gate electrode is connected to the first word line. When a word line driving signal of non-selection level is applied to the first word line, the first switch MISFET is non-conductive. Thus, leakage current is prohibited from flowing through the first switch MISFET. Further, in order to prevent deterioration of the rewrite-down efficiency of the memory, the write-down circuit includes a pn-junction element having a junction characteristic which is substantially equal to the drain junction characteristic of the non-volatile memory elements. The level of a write-down voltage to be applied to the drains of the non-volatile memory element is determined on the basis of the reverse breakdown voltage of the pn-junction element. Thus, the breakdown of the drain junction of the non-volatile memory elements during a write-down operation can be prevented, so that deterioration of the rewrite-down efficiency of the electrically programmable read only memory can be prevented.

15 Claims, 19 Drawing Figures

I II

ELECTRICALLY PROGRAMMABLE READ ONLY MEMORY HAVING REDUCED LEAKAGE CURRENT

BACKGROUND OF THE INVENTION

This invention relates to an electrically programmable read only memory (hereinbelow, abbreviated to "EPROM").

Prior to this invention, an EPROM with its write-down efficiency enhanced has been proposed by the assignee of the present application as disclosed in the specification of Japanese Patent Application No. 55-87867 (J. Sugiura et al, "Semiconductor Device and Method for Fabricating the Same", U.S. patent application Ser. No. 277,393, filed June 25, 1981, German Patent Application No. P 31 24 283.9, British Patent Application No. 81.19691).

In the EPROM of Japanese Patent Application No. 55-87867, a non-volatile memory element thereof has a structure which includes a floating gate electrode and a control gate electrode overlying the floating gate electrode. A high impurity concentration region having the same conductivity type as that of the EPROM substrate is formed in that peripheral portion of the semiconductor surface of the non-volatile memory element which underlies a gate insulating film and which extends in a channel direction. In the non-volatile memory element of such structure, when a source-drain current flows during a write-down operation, the presence of the high impurity concentration region improves the generation efficiency of hot electrons, so that the write-down speed is enhanced.

The specification of the above-mentioned prior application, however, does not teach a construction which solves other problems in EPROMs. Further, a new problem has been found to exist in the structure formed with the high impurity concentration region as described above.

Specifically, the inventors' study has revealed that, to the end of raising the write-down efficiency of charges into a floating gate, a write-down voltage to be applied to a non-volatile memory element should desirably be a greater magnitude in a range in which a pn-junction does not substantially break down. However, when the high impurity concentration region is disposed as stated above, the pn-junction thus formed by the drain of the non-volatile memory element and the high impurity concentration can lead to avalanche breakdown even at a comparatively low reverse voltage. In a case where the pn-junction of the non-volatile memory element has undergone an avalanche breakdown due to a write-down voltage which is not satisfactorily controlled, holes created in the pn-junction due to the avalanche breakdown are injected into the interface between a silicon substrate and silicon dioxide underlying the floating gate of the non-volatile memory element. As a result, electrons which are injected by rewrite-down recombine with the holes in the floating gate, and the rewrite-down efficiency deteriorates. This has also been revealed by the inventors" study. Accordingly, the write-down voltage level must be satisfactorily controlled.

In an integrated circuit, a plurality of non-volatile memory elements are disposed in a matrix form. The drains of a plurality of non-volatile memory elements arranged in the same column are coupled with a single bit line in common, while the control gates of a plurality of non-volatile memory elements arranged in the same row are coupled with a single word line in common. In accordance with such an arrangement, one non-volatile memory element is selected through a certain word line and a certain bit line.

In order to write down information into one non-volatile memory element, a write-down voltage is supplied to one bit line (selected bit line) with which the non-volatile memory element is coupled, and a word line signal at a selection level is supplied to one word line (selected word line). The high level of the write-down voltage is a comparatively high voltage, and it raises the potential of the floating gate to an unnegligible level through the parasitic capacitance between the drain and floating gate of the non-volatile memory element.

As a result, channel leakage currents flow to the non-selected non-volatile memory elements coupled with the selected bit line. The number of non-volatile elements to be coupled with one bit line increases in proportion to the increase of the memory capacity. Accordingly, the leakage currents increase with the increase of the memory capacity. In other words, in a case where the memory capacity has been increased, idle current increases, and this leads to high power consumption.

In addition to the above problem, when the leakage currents have increased excessively, the write-down current flowing to the selected non-volatile memory element decreases accordingly. Therefore, the current driving ability of the write-down circuit must be enhanced. This inevitably necessitates increasing the size of the elements which constitute the write-down circuit.

The leakage currents fluctuate by a comparatively large amount due to not only the manufacturing dispersions of the non-volatile memory elements but also because of the variation of an operating temperature. Accordingly, an appropriately designed write-down circuit is required. Unless such an appropriate write-down circuit is utilized, the product yield is reduced.

It has been found that the leakage currents can be reduced by connecting the sources of a plurality of non-volatile memory elements to the ground point of circuitry through a single common resistor (refer to T. Kihara et al, "Programmable Read Only Memory", U.S. patent application Ser. No. 193,411, filed Oct. 3, 1980, German Offenlegungsschrift No. 3,037,315). The inventors' study, however, has revealed a disadvantage of the prior approach in that since the magnitudes of the leakage currents depend upon the resistance of the common resistor, great dispersions are involved in the leakage currents in accordance with fluctuations in the manufacturing factors of the integrated circuit.

BRIEF SUMMARY OF THE INVENTION

Accordingly, one object of this invention is to provide an EPROM which can reduce its total leakage current to a very small value and in which the total leakage current is not substantially affected by fluctuations in the manufacturing factors of an integrated circuit.

In a first practicable form according to this general inventive idea of this invention, the control gate electrodes of a plurality of non-volatile memory elements are connected to a first word line, the sources of the plurality of non-volatile memory elements are respectively connected to a ground point of circuitry through the drain-source paths of switching MISFETs, and the gate electrode of the switching MISFETs are connected to the first word line.

In a second practicable form, the control gate electrodes of a plurality of non-volatile memory elements are connected to a first word line, the sources of the plurality of non-volatile memory elements are connected to a ground point of circuitry through the drain-source path of a single switching MISFET in common, and the gate electrode of the switching MISFET is connected to the first word line.

In a third practicable form, the control gate electrodes of a plurality of non-volatile memory elements are connected to a first word line, the control gate electrodes of a further plurality of non-volatile memory elements are connected to a second word line, the sources of the former non-volatile memory elements and those of the latter non-volatile memory elements are connected to a ground point of circuitry through the drain-source path of a first switching MISFET and that of a second switching MISFET in common, the gate electrode of the first switching MISFET is connected to the first word line, and the gate electrode of the second switching MISFET is connected to the second word line.

In the practicable forms described above, when a word line driving signal at a non-selection level is applied to one word line, the switching MISFET whose gate is connected to this word line becomes non-conductive, so that leakage current is inhibited from flowing to the switching MISFET.

When assessed from the viewpoint of the integration density of an integrated circuit, the second practicable form is more favorable than the first practicable form, and the third practicable form is still more favorable than the second practicable form.

From the viewpoint of the reduction of leakage current, the third practicable form is slightly inferior to the first and second practicable forms. In the third practicable form, however, in a case where a first word line driving signal at a selection level is applied to the first word line, where a second word line driving signal at a non-selection level is applied to the second word line and where word line driving signals at the non-selection level are applied to the other word lines, only the first switching MISFET becomes conductive so as to permit a reduced leakage current to flow. The second switching MISFET connected to the second word line and the other switching MISFETs connected to the other word lines become non-conductive to inhibit the flow of any leakage current. In the third practicable form, accordingly, the reduced leakage current flows only to the first switching MISFET in the condition of application of the word line driving signals as stated above, so that the inferiority in the reduction of leakage current does not affect the other non-volatile memory elements and the other switching MISFETs connected to the other word lines.

In an EPROM of very large memory capacity (for example, 64 kilobits), therefore, the third practicable form is the most favorable when considering the combined effects with respect to the integration density and the leakage current reduction.

Another object of this invention is to provide an EPROM which includes an arrangement to prevent the rewrite-down efficiency from deteriorating.

In order to achieve this further object in an EPROM according to the present invention, a write-down circuit is provided which includes a pn-junction element which has a junction characteristic substantially equal to the drain-junction characteristic of a non-volatile memory. As a result of this, the level of a write-down voltage to be applied to the drain of the non-volatile memory is determined on the basis of the breakdown voltage of the pn-junction element.

BRIEF DESCRIPTION OF THE DRAWINGS

FIG. 8(A) shows a structural sectional view of a Zener diode of the write-down circuit in the EPROM according to this invention, while FIG. 9(A) shows a plan view of a non-volatile memory array which includes switching MISFETs, while

DESCRIPTION OF THE PREFERRED EMBODIMENTS

Hereunder, this invention will be described in detail in conjunction with embodiments thereof.

Figure 1:
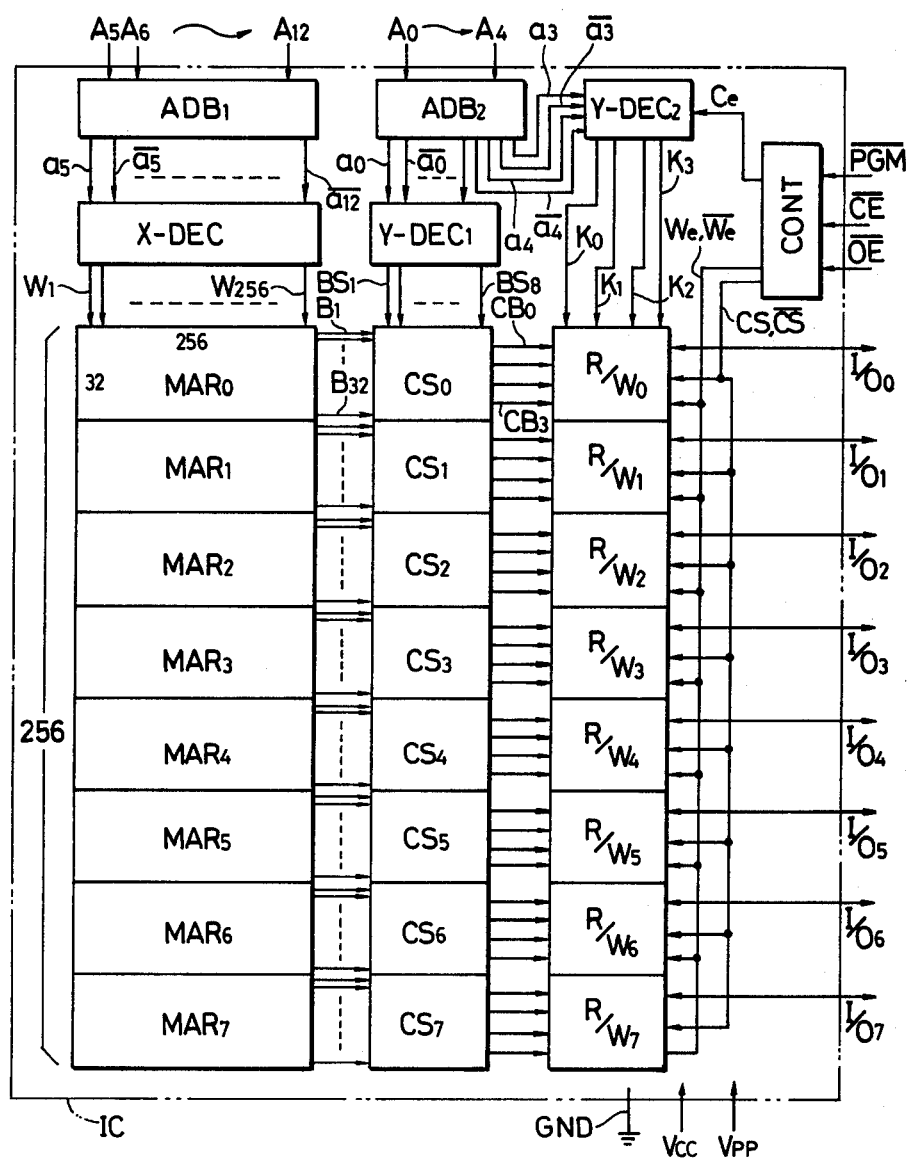
FIG. 1 shows a block diagram of an EPROM according to this invention.

FIG. 1 is a block diagram of an EPROM showing an embodiment of this invention. In this figure, the portion enclosed with a dotted line labelled IC is formed within a single silicon chip by a method of manufacturing a semiconductor integrated circuit to be described later which includes well-known semiconductor manufacturing methods.

Referring now in detail to FIG. 1, the EPROM has input terminals which are supplied with address signals $A_0$ to $A_{12}$, input terminals which are supplied with control signals $\overline{PGM}$, $\overline{CE}$ and $\overline{OE}$, input/output terminals $I/O_0$ to $I/O_7$, a power source terminal which is supplied with a power source voltage $V_{CC}$ of, e.g., 5 volts, another power source terminal which is supplied with a reference voltage GND such as the ground voltage of circuitry, and a write-down power source terminal which is supplied with a write-down voltage $V_{PP}$ that is made a value of, e.g., 25 volts during a programming operation (that is, during the write-down of information). The EPROM is operated by supplying the respective terminals with the appropriate voltages or signals. The particular detailed connections for $V_{CC}$, $V_{PP}$ and GND shown generally in FIG. 1 are illustrated in more detail in subsequent figures.

Although not especially restricted thereto, the EPROM of the embodiment of FIG. 1 includes memory array circuits $MAR_0$ to $MAR_7$ (hereinbelow, written by "$MAR_0$ to $MAR_7$") divided into eight groups. Each of the circuits $MAR_0$ to $MAR_7$ can be provided with a memory capacity of 8192 bits, whereby the EPROM is furnished with a memory capacity of about 64 kilobits as a whole. With this arrangement, each memory array circuit is constructed of 256 word lines, 32 bit lines, 256×32 memory cells, and switching elements for reducing leakage currents as will be described later.

An X-address buffer circuit $ADB_1$ (hereinbelow, simply termed "$ADB_1$") responds to the externally supplied address signals $A_5$–$A_{12}$ of 8 bits at, e.g., TTL (Transistor Transistor Logic) levels, and provides address signals of a true level and a false level $\overline{a_5}$, to a $_{12}$, $\overline{a_{12}}$, respectively, at appropriate levels.

By receiving the address signals $a_5$, $\overline{a_5}$ to $a_{12}$, $\overline{a_{12}}$, an X-decoder circuit X-DEC (hereinbelow, simply termed "X-DEC") forms word line driving signals $W_1$ to $W_{256}$ to be fed to the word lines of the $MAR_0$ to $MAR_7$. Only one of the word line driving signals $W_1$ to $W_{256}$ which corresponds to one combination of the address signals $A_5$ to $A_{12}$ is brought to a selection level, whereas all the others are brought to a non-selection level such as the ground potential of the circuitry.

Figure 2A:
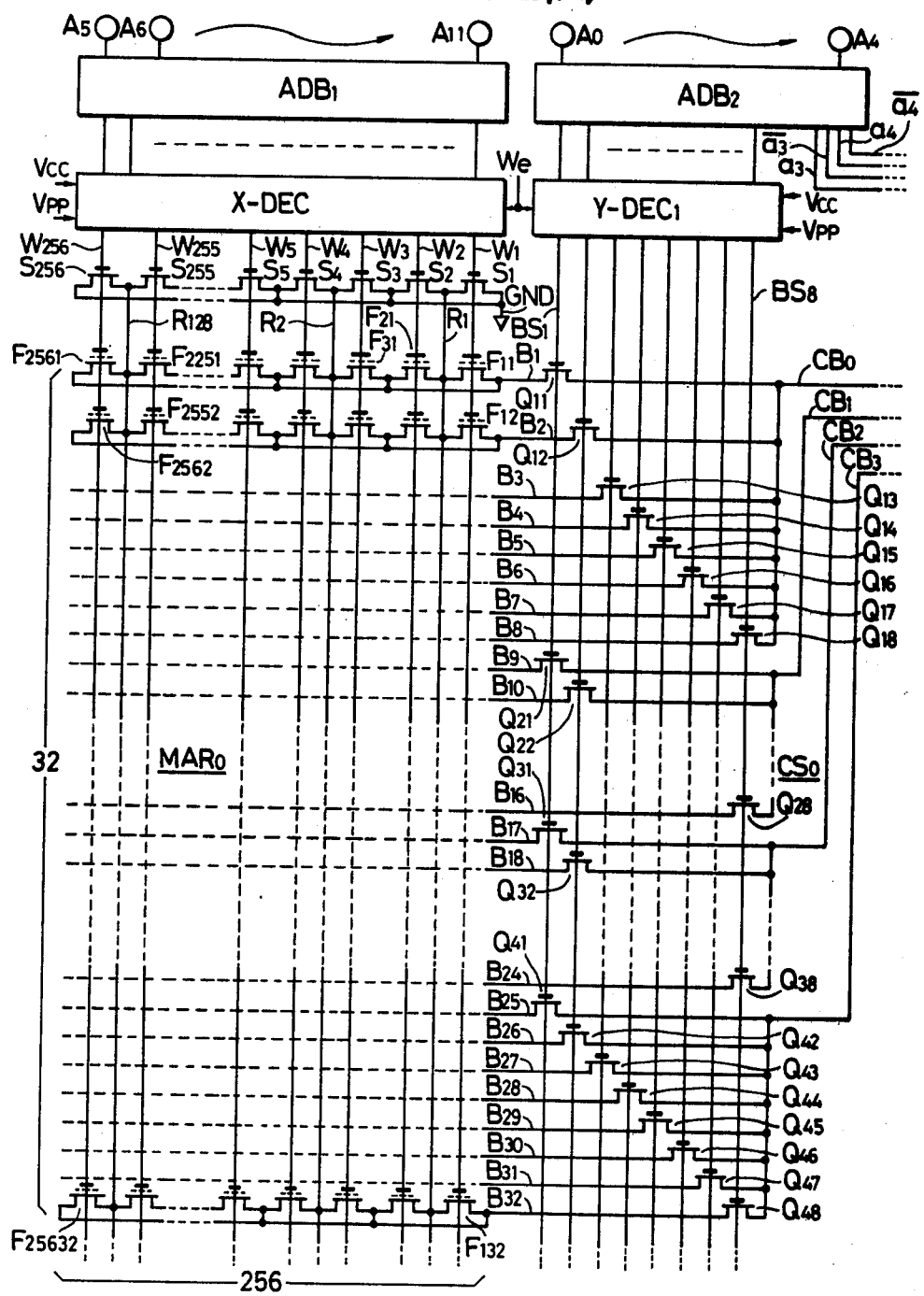
FIGS. 2(A) and 2(B) show a circuit diagram of essential portions in FIG. 1.

As shown in FIG. 2(A), the X-DEC is supplied with the power source voltage $V_{CC}$, the write-down voltage $V_{PP}$ and a control signal We from a control circuit CONT to be described later. This permits the selection level of the word line driving signal to be at a level substantially equal to the power source voltage $V_{CC}$ during a read-out operation of information and at a level substantially equal to the voltage $V_{PP}$ during a write-down operation of information.

A Y-address buffer circuit $ADB_2$ (hereinbelow, simply termed "$ADB_2$") responds the externally fed address signals $A_0$–$A_4$ of 5 bits at, e.g., the TTL levels, and provides address signals of the true level and the false level $a_0$, $\overline{a_0}$ to $a_4$, $\overline{a_4}$, respectively, at appropriate levels. The address signals $a_0$, $\overline{a_0}$ to $a_4$, $\overline{a_4}$ are used for selecting the 32 bit lines of each of the memory array circuits $MAR_0$ to $MAR_7$.

Although the invention is not especially restricted thereto, the embodiment is shown to be arranged so that the bit lines of the respective memory array circuits $MAR_0$ to $MAR_7$ are selected by column switch circuits $CS_0$ to $CS_7$ and read-out/write-down circuits $R/W_0$ to $R/W_7$. Accordingly, among the address signals $a_0$, $\overline{a_0}$ to $a_4$, $\overline{a_4}$, the signals $a_0$, $\overline{a_0}$ to $a_2$, $\overline{a_2}$ are supplied to a first Y-decoder circuit Y-$DEC_1$ (hereinbelow, termed "Y-$DEC_1$"), and the remaining signals $a_3$, $\overline{a_3}$ and $a_4$, $\overline{a_4}$ are supplied to a second Y-decoder circuit Y-$DEC_2$ (hereinbelow, termed "Y-$DEC_2$"). By receiving the address signals $a_0$, $\overline{a_0}$ to $a_2$, $\overline{a_2}$, the Y-$DEC_1$ forms bit line selection signals $BS_1$ to $BS_8$ to be supplied to the column switch circuits $CS_0$ to $CS_7$. Only one of the bit line selection signals $BS_1$ to $BS_8$ which corresponds to one combination of the address signals $A_0$ to $A_2$ is brought to a selection level, whereas all the others are brought to a non-selection level such as the ground potential of the circuitry.

As shown in FIG. 2(A), the Y-$DEC_1$ is supplied with the voltages $V_{CC}$ and $V_{PP}$ and the control signal We similar to those supplied to the X-DEC. This allows the selection level of the bit line selection signal to be made a level substantially equal to the power source voltage $V_{CC}$ during the read-out operation of information and a level substantially equal to the voltage $V_{PP}$ during the write-down operation of information.

By receiving the address signals $a_3$, $\overline{a_3}$ and $a_4$, $\overline{a_4}$, the Y-$DEC_2$ forms selection signals $K_0$ to $K_3$. Only one of the selection signals $K_0$ to $K_3$ which corresponds to one combination of the address signals $A_3$ and $A_4$ is brought to a selection level substantially equal to the power source voltage $V_{CC}$, whereas all the others are brought to a non-selection level such as the ground potential of the circuitry.

Figure 2B:
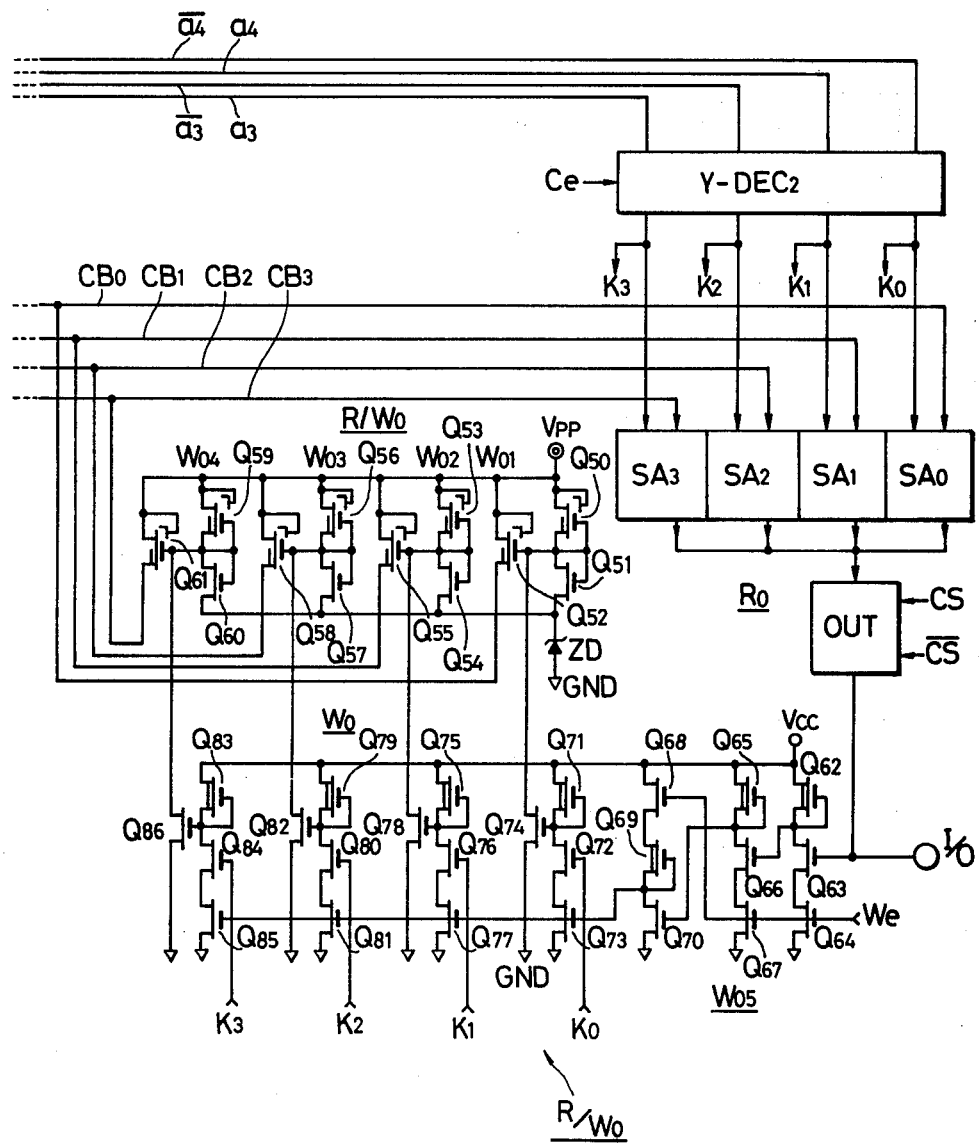

As shown in FIG. 2(B), the Y-$DEC_2$ is supplied with a control signal Ce from the control circuit CONT. By way of example, the control signal Ce is made a high level during the selection of the chip and a low level during the non-selection of the chip. The selection signals $K_0$ to $K_3$ which are provided from the Y-$DEC_2$ are held at the non-selection level during the chip non-selection irrespective of the levels of the address signals $A_3$ and $A_4$.

By receiving the above bit selection signals, the column switch circuits $CS_0$ to $CS_7$ (hereinbelow, simply termed "$CS_0$–$CS_7$") select the bit lines of the corresponding $MAR_0$–$MAR_7$ in groups of four at the same time. That is, four of the 32 bit lines $B_1$ to $B_{32}$ of, for example, the $MAR_0$ are coupled with common bit lines $CB_0$ to $CB_3$ through the column switch circuit $CS_0$.

By way of example, the signals to be switched by the column switch circuits $CS_0$ to $CS_7$ are made a high level near the power source voltage $V_{CC}$ or a low level near the ground potential during the read-out operation of information. On the other hand, they are made a high level near the voltage $V_{PP}$ or a low level near the ground potential during the write-down operation of information. To the end of coupling the bit lines to be selected and the common bit lines with a low voltage loss, the selection level of the bit line selection signals which are supplied to be column switch circuits $CS_0$ to $CS_7$ is established as a level substantially equal to $V_{PP}$ during the write-down operation of information as described above.

The sets of common bit lines, each set including four lines, are respectively coupled to the read-out/write-down circuits $R/W_0$ to $R/W_7$ (hereinbelow, termed "$R/W_0$ to $R/W_7$") as illustrated in FIG. 1.

Each of the $R/W_0$ to $R/W_7$ is constructed of four unit read-out/write-down circuits which correspond in a one-to-one relationship with the four common bit lines $CB_0$–$CB_3$ (see FIG. 2(B)). Input/output terminals of the four unit read-out/write-down circuits in the respective $R/W_0$ to $R/W_7$ are connected in common to the common input/output terminals $I/O_0$ to $I/O_7$. Each unit read-out/write-down circuit is selected by one of the selection signals $K_0$ to $K_3$ delivered from the Y-$DEC_2$. When it is selected, the corresponding common bit line and the common input/output terminal are substantially coupled.

Each unit read-out/write-down circuit is operated by the power source voltage $V_{CC}$ and the write-down voltage $V_{PP}$ supplied during the write-down operation of information (FIG. 2(B)). Each unit read-out/write-down circuit has its operation mode specified by control signals We, $\overline{We}$, Cs and $\overline{Cs}$ provided from the control circuit CONT.

Although the invention is not especially restricted thereto, a read-out mode is specified by the high levels of the control signals $\overline{Cs}$ and $\overline{We}$. In the read-out mode, a signal on one of the four common bit lines is supplied to the common input/output terminal through the unit read-out circuit selected by the Y-$DEC_2$. That is, the common input/output terminal is supplied with data stored in a memory cell selected by the X-DEC, Y-$DEC_1$ and Y-$DEC_2$.

A write-down mode is specified by the high level of the control signal We and the low level of the control signal $\overline{Cs}$. In the write-down mode, among the unit read-out/write-down circuits supplied with data signals from a circuit not shown through the common input-/output terminals, only one selected by the Y-DEC$_2$ is brought into its operative status. Accordingly, one of the four common bit lines has substantially the ground potential level or an appopriate write-down voltage level in response to the data signal to be written down. The remaining three common bit lines have substantially the ground potential level because the corresponding unit read-out/write-down circuits are not selected.

In a chip non-selection mode, the selection signals K$_0$ to K$_3$ which are provided from the Y-DEC$_2$ are established at the non-selection level as described before. Therefore, all the unit read-out/write-down circuits in the R/W$_0$ to R/W$_7$ are brought into their inoperative status. Although not especially restricted thereto, the read-out/write-down circuit is constructed so that its input/output terminals are in the floating state in the chip non-selection mode.

The control circuit (hereinbelow, simply termed "CONT") forms the control signal $\overline{We}$ as indicated in the following Table 1, by receiving an external program control signal $\overline{PGM}$, a chip enable signal $\overline{CE}$, and output enable signal $\overline{OE}$ and the write-down voltage V$_{PP}$ at the predetermined level:

TABLE 1

|  | Read | Program |
|---|---|---|
| V$_{pp}$ | 5 V | 25 V |
| $\overline{PGM}$ | H | L |
| $\overline{CE}$ | L | L |
| $\overline{OE}$ | L | — |
| $\overline{We}$ | H | L |

Using these control signals, the selection of the write-down/read-out operations (in other words, the control of various operation modes such as read-out under a high-voltage application state) is executed.

FIGS. 2(A) and 2(B) show a circuit diagram of a practicable embodiment of the EPROM according to this invention.

Referring to these figures, the MAR$_0$ includes 256×32 non-volatile memory elements F$_{11}$–F$_{25632}$ which are arranged in 32 rows and 256 columns. While the particular structure will be further clarified later, each individual memory element is constructed of a FAMOS (Floating gate Avalanche injection MO transistor) which has a floating gate electrode and a control gate electrode. Among the memory elements, 32 memory elements arranged in the same column have their control gate electrodes connected in common to the corresponding one of the word lines W$_1$–W$_{256}$.

The memory array circuit MAR$_0$ is provided with reference potential lines R$_1$ to R$_{128}$ each of which corresponds to two of the word lines such as the word lines W$_1$ and W$_2$, word lines W$_3$ and W$_4$, etc. Thus, the source electrodes of the 32 memory elements belonging to one column and those of the 32 memory elements belonging to the next column adjoining the first-mentioned column are connected in common to one reference potential line.

Switching MISFETs S$_1$ to S$_{256}$, which are controlled to switch between "on" and "off" states by the signals fed to the word lines, are respectively arranged between the reference potential lines R$_1$ to R$_{128}$ and the ground point of the circuitry.

The drain electrodes of 256 memory elements arranged in the same row are connected in common to the corresponding one of the bit lines B$_1$–B$_{32}$. The bit lines B$_1$–B$_{32}$ are divided into four groups by the column switch circuit CS$_0$. Switching MISFETs are arranged between the respective bit lines and the common bit line. More specifically, switching MISFETs Q$_{11}$–Q$_{18}$ which are controlled by the selection signals formed by the Y-DEC$_1$ are respectively arranged between the bit lines B$_1$–B$_8$ and the common bit line CB$_0$.

Likewise, switching MISFETs Q$_{21}$–Q$_{28}$, Q$_{31}$–Q$_{38}$ and Q$_{41}$–Q$_{48}$ similar to the aforecited ones are respectively arranged between the bit lines B$_9$–B$_{16}$, B$_{17}$–B$_{24}$ and B$_{25}$–B$_{32}$ and the common bit lines CB$_1$, CB$_2$ and CB$_3$. Accordingly, when one selection signal, for example, BS$_1$ formed by the Y-DEC$_1$ is brought to the selection level, the four bit lines B$_1$, B$_9$, B$_{17}$ and B$_{25}$ are simultaneously coupled with the common bit lines CB$_0$, CB$_1$, CB$_2$ and CB$_3$ respectively.

The common bit lines CB$_0$ to CB$_3$ are coupled with the read-out/write-down circuit R/W$_0$. As shown in FIG. 2(B), the read-out/write-down circuit R/W$_0$ is constructed of a write-down circuit W$_0$ and a read-out circuit R$_0$. The write-down circuit W$_0$ is constructed of four unit write-down circuits W$_{01}$ to W$_{04}$ corresponding to the common bit lines CB$_0$ to CB$_3$ one to one, and a single input circuit W$_{05}$.

As shown in the figure, the input circuit W$_{05}$ is constructed of MISFETs Q$_{62}$ to Q$_{70}$. Although not particularly restricted thereto, the MISFETs such as those shown as Q$_{65}$ and Q$_{69}$ with symbols of straight lines drawn between their sources and drains are depletion mode MISFETs and the other MISFETs are enhancement mode MISFETs.

Since the input circuit W$_{05}$ is constructed as shown in the figure, its output terminal (i.e., the drain of the MISFET Q$_{70}$) delivers a signal which is equal to the logical product between the inverted signal of the write-down data signal supplied to a common input/output terminal I/O and the write-down control signal We.

More specifically, when the write-down control signal We is at the high level, the input circuit W$_{05}$ provides a signal at a low level substantially equal to the ground potential or at a high level substantially equal to the power source voltage V$_{CC}$ in accordance with the high level or low level of the data signal supplied to the common input/output terminal I/O. When the write-/down control signal We is at the low level, it provides the signal at the low level substantially equal to the ground potential irrespective of the data signal supplied to the common input/output terminal I/O.

The unit write-down circuit W$_{01}$ includes an output MISFET Q$_{52}$ whose drain is connected to the terminal V$_{PP}$ and whose source is connected to the common bit line CB$_0$, a level shifting MISFET Q$_{51}$ whose gate and drain are connected to the gate of the output MISFET Q$_{52}$ and whose source is connected to a Zener diode ZD, and a MISFET Q$_{50}$ which serves to supply a bias current to the level shifting MISFET Q$_{51}$.

The unit write-down circuit W$_{01}$ further includes a MISFET Q$_{74}$ for controlling "on" and "off" states of the output MISFET Q$_{52}$, MISFET Q$_{72}$ and MISFET Q$_{73}$ constituting a logic gate circuit for controlling "on" and "off" states of the MISFET Q$_{74}$, and a load MIS- FET $Q_{71}$. The gate electrode of the MISFET $Q_{72}$ is supplied with the selection signal $K_0$ delivered from the Y-DEC$_2$, while the gate electrode of the MISFET $Q_{73}$ is supplied with a signal delivered from the input circuit $W_{05}$.

In the illustrated circuit, the output MISFET $Q_{52}$ needs to have a drain breakdown voltage with a sufficient margin with respect to a high voltage (for example, +25 volts) supplied to the terminal $V_{PP}$. In general, the drain breakdown voltage of a MISFET is limited comparatively greatly in proportion to the degree to which the width of a depletion layer in the drain junction surface is limited by a field strength applied from the gate electrode as is well known. Therefore, the output MISFET $Q_{52}$ is preferably made with a stacked gate structure, although it is not necessarily restricted thereto. The first gate electrode thereof is connected to the gate electrode and drain electrode of the MISFET $Q_{51}$, and the second gate electrode close to the drain region thereof is connected to the terminal $V_{PP}$, as shown in the figure.

If necessary, the output MISFET $Q_{52}$ is constructed with the so-called ring gate structure in which the drain region is surrounded with the gate electrode. Also, if necessary, a channel region underlying the first gate electrode of the output MISFET $Q_{52}$ is implemented in the depletion mode to the end of appropriately increasing the write-down voltage level to be supplied to the common bit line. A channel region underlying the second gate electrode is implemented in the enhancement mode. The depletion mode channel region can be formed by the known impurity ion implantation technology. In this case, the quantity of an impurity to be implanted into the channel region can be determined at a much higher accuracy than when employing the impurity diffusion technology. Accordingly, a threshold voltage which is determined by the first gate electrode of the output MISFET $Q_{52}$ is set at a value which is shifted an accurate predetermined value from the threshold voltages of the MISFETs $Q_{51}$, etc.

The biasing MISFET $Q_{50}$ is also preferably made with a stacked gate structure similarly to the MISFET $Q_{52}$. If desired, each of the MISFETs $Q_{52}$ and $Q_{50}$ can be replaced with two MISFETs connected in series. However, when the MISFETs $Q_{52}$ and $Q_{50}$ are implemented in the stacked gate structure as described above, they can be advantageously made comparatively small in size.

In this embodiment, the breakdown voltage of the constant voltage diode ZD (hereinbelow, also termed "Zener diode") is made a value substantially equal to the drain junction breakdown voltages of the non-volatile memory elements, and it is allowed to have a dispersion substantially equal to that of the drain junction breakdown voltages of the non-volatile memory elements.

To this end, the well-known feature in the integrated circuit producing technology that a plurality of elements simultaneously formed exhibit comparatively small relative dispersions in characteristics is exploited. As will be better understood from later description, semiconductor regions for constructing the constant voltage diode ZD are formed simultaneously with semiconductor regions for constructing the non-volatile memory elements.

The bias current of the constant voltage diode ZD is supplied from the terminal $V_{PP}$ through the MISFETs $Q_{50}$ and $Q_{51}$ by way of example. The level shifting MISFET $Q_{51}$ is constructed so that a voltage substantially equal to its threshold voltage is provided between its drain and source. Now, letting A denote the size ratio W/L (W: channel width, L: channel length) of the MISFET $Q_{50}$, and B denote the size ratio W/L of the MISFET $Q_{51}$, $B<<A$ is held. Thus, the level shift amount $V_1$ is evaluated from the following expression (1) where $V_{thD}$ denotes the threshold voltage of the MISFET $Q_{50}$ and $V_{thE}$ denotes the threshold voltage of the MISFET $Q_{51}$:

$$V_1 = \sqrt{A/B}\, V_{thD} + V_{thE} \approx V_{thE} \qquad (1)$$

The unit write-down circuit $W_{01}$, the input circuit $W_{05}$ and the associated circuits as shown in FIG. 2(B) operate as follows:

During the write-down operation of information, the terminal $V_{PP}$ is supplied with a high voltage $V_{PP}$ (for example, +25 volts), and the gate electrodes of the MISFETs $Q_{64}$, $Q_{67}$ and $Q_{68}$ of the input circuit $W_{05}$ are supplied with the write-down control signal We at a level which is substantially equal to the power source voltage $V_{CC}$. If, at this time, the selection signal $K_0$ delivered from the Y-DEC$_2$ is at the selection level or at the high level substantially equal to the voltage $V_{CC}$, the MISFET $Q_{72}$ will be thereby brought into the "on" state. If, on the other hand, the data signal supplied to the common input/output terminal I/O from a circuit not shown is at the low level, the drain of the MISFET $Q_{70}$ of the input circuit $W_{05}$ will provide the high level signal to bring the MISFET $Q_{73}$ into the "on" state.

Since the MISFETs $Q_{72}$ and $Q_{73}$ connected in series are concurrently brought into their "on" states, a voltage substantially equal to the ground potential GND of the circuitry is applied to the gate electrode of the MISFET $Q_{74}$. As a result, the MISFET $Q_{74}$ is brought into the "on" state. The turn-off of the MISFET $Q_{74}$ results in supplying the gate electrode of the MISFET $Q_{52}$ with a voltage which is substantially equal to the sum $V_Z + V_{thE}$ between the Zener voltage $V_Z$ of the Zener diode ZD and the threshold voltage $V_{thE}$ of the MISFET $Q_{51}$.

The output MISFET $Q_{52}$ whose threshold voltage is denoted by $V_{thD}$ maintains its "on" state until the potential of its source electrode is increased to $(V_Z + V_{thE}) - V_{thD}$, that is, until it is increased to a potential higher than the Zener voltage $V_Z$ by the threshold voltage difference $V_{thE} - V_{thD}$. Accordingly, the write-down voltage of a value close to the Zener voltage $V_Z$ is supplied from the source electrode of the output MISFET $Q_{52}$ to the common bit line CB$_0$.

The write-down voltage supplied to the common bit line CB$_0$ is fed to one of the bit lines B$_1$ to B$_8$ through the column switch circuit CS$_0$. More specifically, when the memory element to be selected is the element $F_{11}$, for example, the write-down voltage is supplied to the bit line B$_1$. In this case, the word line driving signal $W_1$ is brought to the selection level substantially equal to the voltage $V_{PP}$ by the X-DEC.

Owing to the selection level of the word line driving signal $W_1$, the memory element $F_{11}$ and the switching MISFET $S_1$, which is disposed between the source electrode of this memory element and the ground point GND of the circuitry, are both brought into the "on" states. As a result, the write-down current is poured into the memory element $F_{11}$. Thus, the threshold voltage of the memory element $F_{11}$ is changed from a value which is lower than the selection level (for example, a level of 5 volts which is substantially equal to the voltage $V_{CC}$) of the word line driving signal $W_1$ delivered from the X-DEC during the read-out operation of information, into a value which is higher than the selection level during the read-out.

In accordance with this embodiment, voltage drops which develop in such a manner that the write-down current flows through the ON resistance between the source and drain of the MISFET, e.g., the MISFET $Q_{11}$ in the column switch circuit $CS_0$, a resistance existing on the common bit line, the source output resistance of the output MISFET $Q_{52}$, etc. are substantially cancelled by the threshold voltage difference $V_{thE}-V_{thD}$ between the MISFETs $Q_{51}$ and $Q_{52}$.

In this case, by forming the MISFETs $Q_{51}$ and $Q_{52}$ on an identical semiconductor substrate substantially simultaneously, the threshold voltages of the respective MISFETs $Q_{51}$ and $Q_{52}$ undergo dispersions and fluctuations in values substantially equal to each other. Accordingly, the threshold voltage difference $V_{thE}-V_{thD}$ is not substantially affected by the absolute values of the dispersions and fluctuations of the threshold voltages of the respective MISFETs. Since the change amount of the threshold voltage of the output MISFET $Q_{52}$ is determined by the impurity quantity introduced into the channel region by the ion implantation technology as stated before, the threshold voltage difference $V_{thE}-V_{thD}$ can be determined comparatively accurately.

Accordingly, the voltage drops developing across the resistance components can be satisfactorily cancelled irrespective of the dispersions of the threshold voltages of the MISFETs. Therefore, the bit lines can be supplied with a write-down voltage having a value which is very close to the Zener voltage $V_Z$ of the Zener diode ZD irrespective of the characteristic dispersions and characteristic fluctuations of the integrated circuit. In other words, the bit lines can be supplied with a write-down voltage having a value very close to the drain junction breakdown voltage of the non-volatile memory elements. The write-down voltage to be supplied to the bit line is thus sufficiently raised, with the result that information charges in a sufficient amount are injected into the floating gate of the memory element.

If desired, the output MISFET $Q_{52}$ shown in FIG. 2(B) can be an enhancement mode MISFET. Even in this case, a write-down voltage at a comparatively good level can be supplied to the bit line owing to the voltage $V_Z$ delivered from the Zener diode ZD. In this case, however, note must be taken of the fact that the write-down voltage is somewhat lowered in comparison with that in the case where the output MISFET $Q_{52}$ is implemented in the depletion mode. Therefore, the information charges to be injected into the floating gate of the memory element decrease.

In the circuit of FIG. 2(A), when the bit line $B_1$ has been supplied with the write-down voltage and the word line driving signal $W_1$ is at its selection level to turn on $F_{11}$ as stated above, the potentials of the floating gates of the memory elements $F_{21}$ and $F_{2561}$ are raised to unnegligible levels through the parasitic capacitances between the respective floating gates and the respective drain electrodes because the write-down voltage has a comparatively large value. As a result, the non-selected memory elements $F_{21}$ and $F_{2561}$ will be substantially brought into their "on" states in spite of the non-selection level of the word line driving signals $W_2$ to $W_{256}$. If the switching MISFETs $S_1$ to $S_{256}$ are omitted, the turning-on of the non-selected memory elements will lead to a large leakage current between the bit line $B_1$ and the ground point GND of the circuit. However, if the switching MISFETs $S_2$ to $S_{256}$ are provided, this is substantially reduced, as discussed above.

Between the source and drain of the switching MISFET $S_1$ in the "on" state, the write-down current is poured through the selected memory element $F_{11}$, and hence, a voltage appears. The memory element $F_{21}$ has its source electrode supplied with the drain voltage of the switching MISFET $S_1$, so that it gives rise to a comparatively small leakage current, or that it is substantially maintained in the "off" state.

In this embodiment, the switching MISFETs $S_3$ to $S_{256}$ arranged between the source electrodes of the memory elements $F_{31}$ to $F_{2561}$ and the ground point GND of the circuitry are held in the "off" states because the word line driving signals $W_3$ to $W_{256}$ are at the non-selection level. Accordingly, although the memory elements $F_{31}$ to $F_{2561}$ are substantially brought into their "on" states as described above, the channel leakage current is substantially prevented from flowing between the bit line $B_1$ and the ground point GND of the circuitry because the switching MISFETs $S_3$ to $S_{256}$ are held in their "off" states to prevent such a leakage current flow.

In a case where the channel leakage currents do flow to ground through the respective memory elements $F_{31}$ to $F_{2561}$, due to the omission of the switching MISFETs $S_1$ to $S_{256}$, a large overall leakage current flows even when the respective channel currents are small. In contrast, according to this embodiment, the leakage current can be reduced to a substantially negligible magnitude.

Since the leakage currents which flow through the memory arrays are reduced to a substantially negligible extent, the current driving ability of the write-down circuit can be lowered. In other words, the sizes of the output MISFET $Q_{52}$, etc. can be made small. In addition, the write-down current to be provided from the write-down circuit can be set without considering the dispersion and fluctuation of the leakage current, and the design of the circuitry as well as the elements can be facilitated. Accordingly, an enhancement in the production yield can be achieved.

Instead of disposing the reference potential lines corresponding to the word lines as in FIG. 2(A), it is allowed by way of example that the sources of a plurality of memory elements belonging to one bit line are connected to the ground point of the circuitry through a common resistance. In this case, a voltage is formed across the common resistance by a write-down current to be poured to one selected memory element. The voltage developing across the common resistance is supplied to the sources of the non-selected memory elements. The non-selected memory elements have their source potentials raised, and are thereby brought into their "off" states. Even with this measure, the occurrence of leakage currents can be prevented (refer to T. Kihara et al, "Programmable Read Only Memory", U.S. patent application Ser. No. 193,411, filed Oct. 3, 1980, German Offenlegungsschrift 3,037,315).

In this case, however, it must be noted that in order to prevent the leakage currents in the non-selected memory elements, the resistance value of the common resistor needs to be made comparatively great. As a result, a comparatively great voltage drop is developed across the common resistor of the high resistance by the write-down current. This voltage is also supplied to the source of the memory element to be selected. Accordingly, the write-down current of the memory element to be selected is reduced, and the write-down efficiency of information is deteriorated.

The switching MISFETs as shown in FIG. 2(A) can be implemented in a structure which has a sufficiently low ON-resistance value. Accordingly, the efficiency of the information write-down into the memory to be selected is not substantially limited by the switching MISFETs.

In the circuit shown in FIG. 2(B), when the common input/output terminal I/O is supplied with the data signal of the high level, the output signal of the input circuit $W_{05}$ (the drain output of the MISFET $Q_{70}$) is brought to the low level substantially equal to the ground potential, and the MISFET $Q_{73}$ is brought into the "off" state.

When the MISFET $Q_{73}$ goes "off", the MISFET $Q_{74}$ is brought into the "on" state. Then the gate electrode of the MISFET $Q_{52}$ is substantially brought to the ground potential GND by the MISFET $Q_{73}$. As a result, the common bit line $CB_0$ is supplied with only a voltage of a comparatively small value through the MISFET $Q_{52}$. Accordingly, no charge is injected into the floating gate of the selected memory element $F_{11}$.

When the selection signal $K_0$ provided from the Y-$DEC_2$ is at the non-selection level, and when the write-down control signal We is at the low level, at least one of the MISFETs $Q_{72}$ and $Q_{73}$ responds thereto to fall into the "off" state. As a result, the MISFET $Q_{74}$ goes to the "on" state.

The unit write-down circuits $W_{02}$ to $W_{04}$ have the same arrangement as that of the unit write-down circuit $W_{01}$ as shown in the figure. Although in the illustrated embodiment, a single Zener diode ZD is disposed in common to the unit write-down circuits $W_{01}$ to $W_{04}$, the invention is not necessarily restricted to this.

According to the arrangement shown in FIGS. 2(A) and 2(B), the bias current of the Zener diode ZD is supplied through one of the unit write-down circuits $W_{01}$ to $W_{04}$. By way of example, the bias current is supplied through the MISFETs $Q_{50}$ and $Q_{51}$ when the MISFET $Q_{74}$ is brought into the "off" state. In this case, the drain electrodes of the MISFETs $Q_{54}$, $Q_{57}$ and $Q_{60}$ are respectively brought to the ground potential of the circuitry by MISFETs $Q_{78}$, $Q_{82}$ and $Q_{86}$ and function substantially as the source electrodes. Accordingly, the MISFETs $Q_{54}$, $Q_{57}$ and $Q_{60}$ are brought into the "off" states. Since the MISFETs $Q_{54}$, $Q_{57}$ and $Q_{60}$ are brought into the "off" states, the normal bias current is supplied to the Zener diode ZD.

In this embodiment, the read-out circuit $R_0$ is constructed of sense amplifiers $SA_0$ to $SA_3$ which correspond to the common bit lines $CB_0$ to $CB_3$ one to one, and an output buffer circuit OUT.

The sense amplifiers $SA_0$ to $SA_3$ are selectively operated by the selection signals $K_0$ to $K_3$ which are provided from the Y-$DEC_2$.

The output buffer circuit OUT supplies the common input/output terminal I/O with a signal of a level corresponding to an output signal of one selected sense amplifier. The output terminal of the output buffer circuit OUT is brought into a floating state in such a way that the control signal CS is at a low level as during the chip non-selection.

Figure 3:
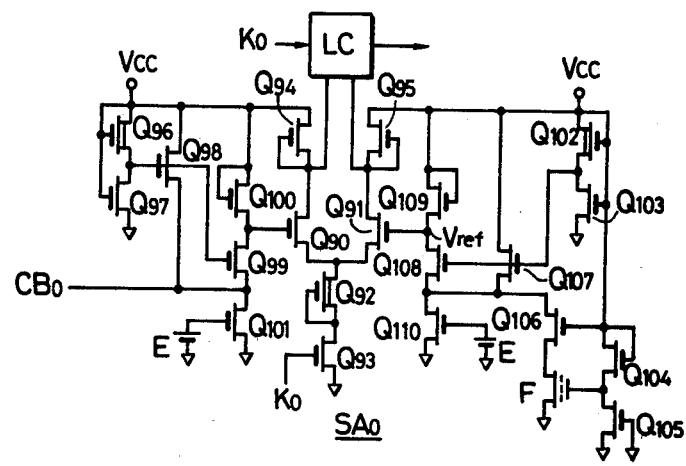
FIG. 3 shows a circuit diagram of a sense amplifier which is included in the EPROM according to this invention.

FIG. 3 shows a practicable circuit arrangement of the sense amplifier $SA_0$ and circuits associated therewith.

In FIG. 3, the common bit line $CB_0$ is connected to the source electrode of an amplifying MISFET $Q_{99}$ and the drain electrode of a constant current MISFET $Q_{101}$. The gate of the MISFET $Q_{99}$ is connected to the common juncture of MISFETs $Q_{96}$ and $Q_{97}$ which are connected in series between the power source terminal and the ground point of the circuitry so as to form a predetermined bias voltage.

The common bit line $CB_0$ is also connected to the source electrode of a MISFET $Q_{98}$ whose gate is connected to the common juncture of the MISFETs $Q_{96}$ and $Q_{97}$ and whose drain is connected to the power source terminal.

Accordingly, during the read-out operation of information, the bias voltage is applied through the MISFET $Q_{98}$ in the sense circuit $SA_0$ to one memory element selected by the X-DEC and Y-$DEC_1$. In accordance with information written down previously, the selected memory element has a threshold voltage which is higher or lower than the selection level of the word line driving signal as stated before.

In a case where the selected memory element is held in the "off" state irrespective of the selection level of the word line driving signal, the common bit line $CB_0$ is brought to a comparatively high level by the MISFET $Q_{98}$. On the other hand, when the selected memory element is held in the "on" state by the selection level of the word line driving signal, the common bit line $CB_0$ is brought to a comparatively low level.

In the above cases, the high level of the common bit line $CB_0$ is actually a relatively low level because the gate voltage of the MISFET $Q_{98}$ is held comparatively low. Similarly, the low level of the common bit line $CB_0$ can be made a relatively high level by properly setting the size ratios of the MISFETs $Q_{98}$ and $Q_{99}$ and the memory element, etc. When the high levels and low levels of the common bit line $CB_0$ are limited in this manner, the speed of read-out can be quite fast in spite of the fact that capacitances such as stray capacitances limiting the signal changing speed exist in the common bit line $CB_0$, etc. In other words, in such a case where data from a plurality of memory elements are read out in succession, the period of time in which one level of the common bit line $CB_0$ is changed to the other level can be quite short.

The amplifying MISFET $Q_{99}$ has the fixed bias voltage applied to its gate, and the read-out signal from the common bit line $CB_0$ applied to its source. Therefore, it constructs a common-gate amplifier together with a load MISFET $Q_{100}$. An amplified output signal provided at the drain of the MISFET $Q_{99}$ is applied to the gate of one differential MISFET $Q_{90}$.

The gate of the other differential MISFET $Q_{91}$ is supplied with a reference voltage $V_{ref}$ which is formed by a reference voltage generating circuit at the succeeding stage. The reference voltage generating circuit includes a dummy memory element F. The gate of the dummy memory element F is connected to the common juncture between MISFETs $Q_{104}$ and $Q_{105}$ which are connected in series between the power source terminal and the ground point of the circuitry so as to form a predetermined medium voltage. A MISFET $Q_{106}$ is connected to the drain electrode of the dummy memory element F to serve as a dummy which corresponds to the MISFETs of the column switch circuit.

A circuit such as that constructed of the MISFETs $Q_{96}$ to $Q_{101}$ which was discussed previously can also be formed by the MISFETs $Q_{102}$, $Q_{103}$ and $Q_{107}$ to $Q_{110}$.

As shown in the figure, the dummy memory element F and the MISFET $Q_{106}$ are connected to the source electrodes of the MISFETs $Q_{107}$ and $Q_{108}$ and the drain of the constant current MISFET $Q_{110}$. A potential of the medium value between the high level and low level of the common bit line $CB_0$ is applied to the source electrode of the MISFET $Q_{108}$ by the dummy memory element F and the MISFET $Q_{106}$. As a result, the reference voltage $V_{ref}$ at a medium level between the read-out high level and low level which are delivered to the drain of the MISFET $Q_{99}$ is provided at the drain of the amplifying MISFET $Q_{108}$.

Since the reference voltage generating circuit of this form has an arrangement similar to the circuit constructed of the MISFETs $Q_{96}$ to $Q_{101}$, the column switch circuit and the memory elements, it provides a reference voltage $V_{ref}$ having a satisfactory level irrespective of the fluctuations of the threshold voltages of the MISFETs, etc.

The common source of the differential MISFETs $Q_{90}$ and $Q_{91}$ is coupled to a MISFET $Q_{92}$ which functions as a constant current element. In addition, this common source is coupled to a MISFET $Q_{93}$ whose gate electrode is supplied with the selection signal $K_0$ from the Y-DEC$_2$ in order to select the sense amplifier.

On the other hand, the drains of the differential MISFETs $Q_{90}$ and $Q_{91}$ are respectively provided with load MISFETs $Q_{94}$ and $Q_{95}$. The amplified output signal of this differential amplifier circuit is transmitted to the output buffer circuit OUT through a latch circuit LC.

The latch circuit LC also has the selection signal $K_0$ applied thereto, and is selected together with the sense amplifier $SA_0$. The latch circuit LC is constructed so that when it is selected by the signal $K_0$, it provides its output terminal with a signal corresponding to the signal delivered from the differential amplifier circuit. When not selected by the signal $K_0$, it brings its output terminal into the floating state. The respective latch circuit output terminals for each of the sense amplifiers $SA_0$ to $SA_3$ are coupled to an input terminal of an output buffer circuit OUT. Accordingly, the input terminal of the output buffer circuit OUT is supplied with only the output signal of that one of the sense amplifiers $SA_0$ to $SA_3$ which has been selected by the selection signals $K_0$ to $K_3$.

Figures 4, 5:
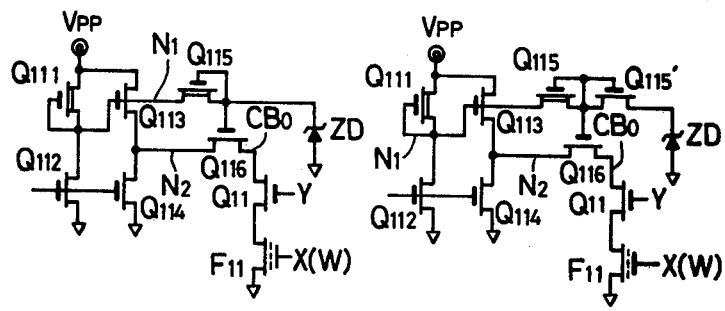
FIGS. 4 and 5 are circuit diagrams showing modified embodiments of a write-down circuit.

Each of FIGS. 4 and 5 shows a write-down circuit of another embodiment which can replace the write-down output circuit shown in FIG. 2(B). In each of the circuits of these alternative embodiments, an output circuit constructed of MISFETs $Q_{111}$ to $Q_{114}$ is disposed. In the preceding stage of the output circuit, a suitable logic gate circuit which is supplied with the write-down control signal We, the write-down data and the selection signal is disposed. Signals at a level substantially equal to $V_{PP}$ are provided at the output terminals $N_1$ and $N_2$ of the output circuit during the write-down operation if the data supplied to the common input/output terminal is "0" or at the low level. A MISFET $Q_{116}$ is disposed between the output terminal $N_2$ of the output circuit and the corresponding common bit line (for example, $CB_0$). A Zener diode ZD similar to that in the foregoing embodiment of FIG. 2(B) is connected to the output terminal $N_1$ through a current clamping MISFET $Q_{115}$. The gate of the MISFET $Q_{116}$ is connected to the Zener diode ZD directly or through a level shifting MISFET $Q_{115}'$ (FIG. 5). Accordingly, the voltage of the common bit line $CB_0$ is determined by the MISFET $Q_{116}$.

In the circuit of the embodiment in FIG. 4, a Zener voltage is directly applied to the gate of the clamping MISFET $Q_{116}$. In response thereto, the voltage of the common bit line $CB_0$ lowers a component equal to the threshold voltage of the MISFET $Q_{116}$. Accordingly, avalanche breakdown does not occur in the non-volatile memory element $F_{11}$. In accordance with the circuit of this embodiment, the voltage which is applied to the drain of the memory element $F_{11}$ during the write-down becomes comparatively low. Accordingly, the circuit is not proper in a case where a comparatively high write-down speed is required.

In the circuit of the embodiment in FIG. 5, the level shifting MISFET $Q_{115}'$ is disposed as in the embodiment of FIG. 2(B). In accordance with the circuit of FIG. 5, therefore, the voltage which is applied to the gate of the MISFET $Q_{116}$ is raised approximately by the threshold voltage $V_{thE}$ of the MISFET $Q_{115}'$ with respect to the voltage of the Zener diode ZD, as in the circuit of the embodiment in FIG. 2(B). As a result, the potential of the common bit line can be set substantially at the Zener voltage as in the circuit of the embodiment in FIG. 2(B).

Thus, the write-down voltage to be applied to the bit line can be accurately set at a magnitude which is necessary for preventing avalanche breakdown in the non-volatile memory element and which is close to the maximum voltage. Accordingly, the non-volatile memory element is permitted to perform a high-speed write-down operation.

The circuit which executes the voltage clamping in the write-down circuit in this manner can be variously modified. Typically, for such a constant voltage element for prescribing the clamp voltage, it is convenient to utilize the semiconductor regions which are formed simultaneously with the formation of the semiconductor regions of the non-volatile memory element as stated before. However, this is not restrictive, and various known constant voltage circuits may well be utilized.

Figure 6A:
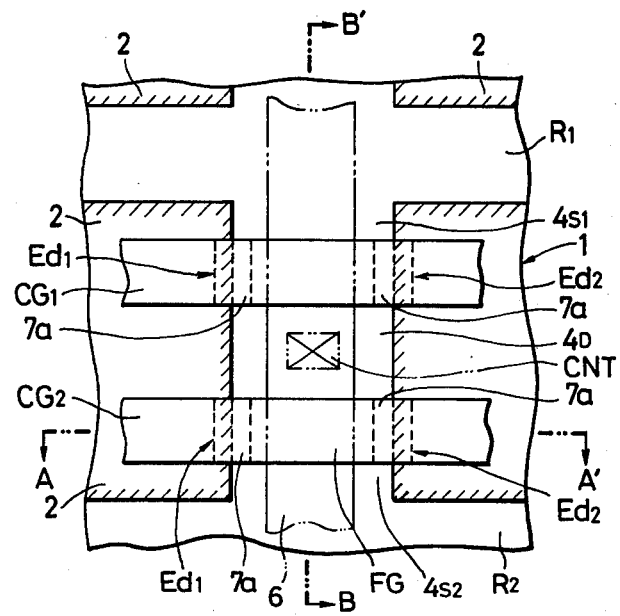
FIG. 6(A) shows a plan view of a non-volatile memory element which is included in the EPROM according to this invention.
Figure 6B:
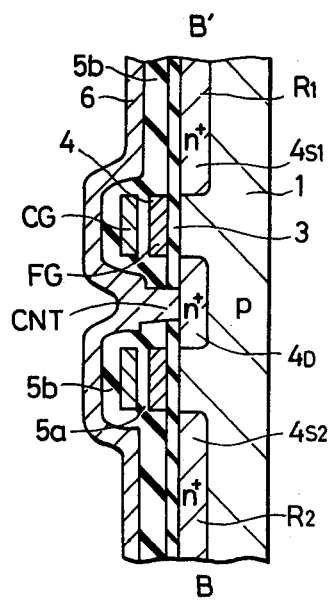
FIG. 6(B) shows a view of one section in FIG. 6(A)
Figure 6C:
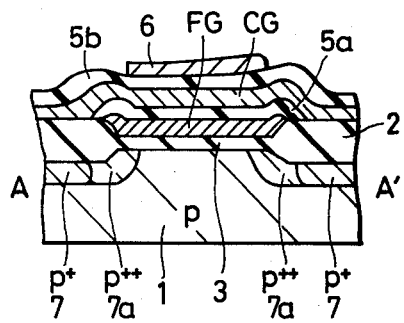
FIG. 6(C) shows a view of another section in FIG. 6(A)

In order to attain a high-speed write-down operation, the non-volatile memory elements $F_{11}$, etc. are preferably fabricated in a structure as shown in FIGS. 6(A)–6(C). FIG. 6(A) is a pattern diagram, FIG. 6(B) is a sectional view taken along B—B' in FIG. 6(A), and FIG. 6(C) is a sectional view taken along A—A' in FIG. 6(A).

Referring to FIGS. 6(A) to 6(C), numeral 1 designates a semiconductor substrate made of a p-type Si (silicon) single crystal in which a conductivity type determining impurity is contained at, for example, $10^5$ atoms/cm$^3$. One major surface of the substrate 1 is formed with a thick field $SiO_2$ (silicon oxide) film 2. A portion of the substrate surrounded with the field $SiO_2$ film 2 is made an active region. The substrate surface which constitutes the active region is formed with a thin gate $SiO_2$ film 3. The gate $SiO_2$ film 3 is overlaid with a floating gate FG which is made of a first conductive polycrystalline Si layer. The floating gate electrode FG is, in turn, overlaid through an intermediate insulating flim 5a with a control gate electrode CG which is made of a second conductive polycrystalline Si layer substantially forming a word line.

Although not especially restricted thereto, the floating gate FG has a width equal to that of the control gate CG and is extended onto the field $SiO_2$ film 2. In FIG. 6(A), the end parts of the floating gate FG are indicated by broken lines $E_{d1}$ and $E_{d2}$.

In the portion of the surface of the semiconductor substrate 1 which is not surrounded with the field $SiO_2$ film 2 and the gate electrodes, $n^+$-type semiconductor regions $R_1$ $4_{S1}$, $4_D$, $4_{S2}$ and $R_2$ are formed by introducing an n-type impurity at a comparatively high concentration.

The $n^+$-type semiconductor region $4_{S1}$ is used as the source region of one non-volatile memory element. The $n^+$-type semiconductor region $R_1$ which is extended in the lateral direction on the drawing as shown in FIG. 6(A) is used as a region constructing a reference potential line. The source region $4_{S1}$ and the wiring region $R_1$ are integrally formed as shown in the drawing.

The $n^+$-type semiconductor region $4_{S2}$ is similarly used as the source region of another non-volatile memory element, and the $n^+$-type semiconductor region $R_2$ is used as a wiring region. The $n^+$-type semiconductor region $4_D$ is used as the common drain regions of the pair of non-volatile memory elements.

Over the control gate electrode CG, a wiring layer 6 which forms a bit line (made of, for example, an evaporated aluminum layer) is formed through an intermediate insulating film 5b in a manner to intersect orthogonally to the control gate electrode. This wiring layer 6 is held in ohmic contact with the drain region $4_D$ in a contact portion CNT.

As illustrated in FIG. 6(C), in the surface of the semiconductor substrate 1 underneath the field $SiO_2$ film 2, a $p^+$-type region 7 which has the same conductivity type as that of the substrate and an impurity concentration higher than that of the substrate is formed as a channel stopper. Further, if necessary, a $p^{++}$-type region 7a having a still higher impurity concentration is formed in that part of the channel portion of the semiconductor non-volatile memory element which is close to the field $SiO_2$ film 2.

According to the non-volatile memory element of such structure, when, by way of example, the write-down voltage is applied to the drain region $4_D$ and the word line driving signal of the selection level is applied to the control gate $CG_1$, the spread of a depletion layer to spread to the $p^{++}$-type region 7a from the junction portion between the drain region $4_D$ and the $p^{++}$-type region 7a is limited. Due to this, the drain field strength is intensified accordingly. Electrons which form a channel current are then accelerated to a greater degree than normal by the high drain field strength. Accordingly, high energy is afforded to electron-hole pairs which are created when the electrons have collided against semiconductor crystal lattices. In other words, the generation efficiency of hot electrons is improved, and the write-down speed is sharply enhanced.

In the non-volatile memory element, when electrons are injected into the floating gate FG through the gate $SiO_2$ film 3, this floating gate FG is driven to a negative potential. As a result, a threshold voltage for the control gate CG is made a comparatively great value such as, for example, about 7 volts. In contrast, in a case where electrons are not injected into the floating gate FG, a threshold voltage for a voltage to be applied to the control gate CG is made a comparatively low value such as, for example, about 2 volts.

Accordingly, when the selection level of the word line driving signal, i.e., the level of the signal to be applied to the control gate CG, is set at a medium value between the high and low threshold voltages of the memory element (e.g., 5 volts in the read-out-operation), the memory element falls into the "on" state or "off" state, depending upon whether or not the electrons are injected into the floating gate FG in advance. Therefore, the read-out can be carried out.

Although this is not especially restrictive, the non-volatile memory element as described above can be fabricated in accordance with a method of manufacture to be described below. FIGS. 7(A)–7(F) show sectional views of a semiconductor substrate in respective manufacturing steps. Accordingly, the method of manufacturing an embodiment will now be described with reference to FIGS. 7(A)–7(F).

The left half parts I of FIGS. 7(A)–7(F) show a non-volatile memory element, while the right half parts II show a MISFET for constructing a peripheral circuit.

(a) First, a semiconductor substrate 1 made of single-crystal p-type silicon whose major surface is parallel to the (100) plane, which is about 200 μm thick and which has a resistivity of about 20 Ωcm is prepared.

A thin thermally-oxidized $SiO_2$ film 3' having a thickness of, e.g., several hundred Å is formed on the surface of the substrate 1 in accordance with known thermal oxidation technology in order to prevent crystal defects from being induced in the surface of the substrate 1 due to a silicon nitride film to be formed later.

Subsequently, the silicon nitride ($Si_3N_4$) film 8 which is about 1400 Å thick is formed on the $SiO_2$ film 3' in accordance with known chemical vapor disposition technology using silane gas and ammonia gas.

A photoresist film (not shown) for an etching mask is formed on the $Si_3N_4$ film 8, whereupon the photoresist film is selectively exposed to light and is developed. As a result, the photoresist film is left on parts of the substrate 1 which are to comprise active regions for the formed devices.

Subsequently, using the remaining photoresist film as an etching mask, the $Si_3N_4$ film 8 is etched and removed. For the etching of the $Si_3N_4$ film 8, plasma etching using freon gas as a reaction gas in accordance with known techniques can be employed.

After removing the aforecited photoresist film, a new photoresist film 9 is formed on the substrate 1. The photoresist film 9 is selectively exposed to light and is developed in order that a window for forming the $p^{++}$-type region 7a as shown in FIGS. 6(A) to 6(C) may be formed by the combination between the $Si_3N_4$ film 8 and the photoresist film 9.

Figure 7A:
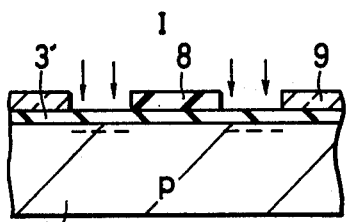
FIGS. 7(A) to 7(F) are process sectional views for explaining a method of manufacturing the EPROM according to this invention.
Figure 7A:
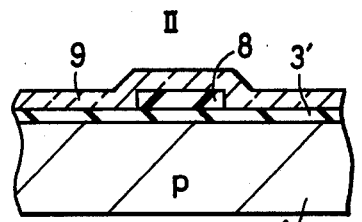
Figure 7B:
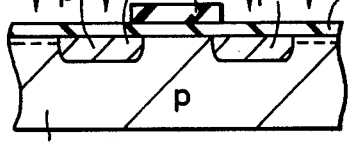
Figure 7B:
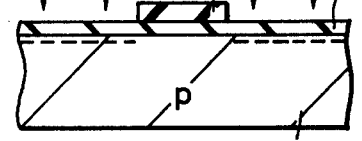
Figure 7C:
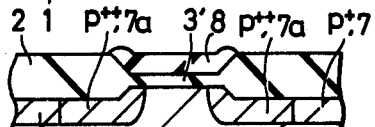
Figure 7C:
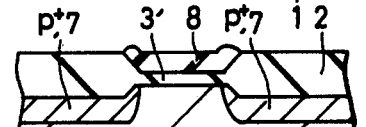

Using the remaining photoresist film 9 and $Si_3N_4$ film 8 as an ion implantation mask, a p-type impurity is introduced into the surface of the substrate 1 through the $SiO_2$ film 3' in accordance with known ion implantation technology, as illustrated in FIG. 7(A). In this case, $BF_2^+$ (boron fluoride) may be used as impurity ions, although the invention is not restricted to this. The impurity ions are given energy of, e.g., 75 keV, and are implanted into the surface of the substrate 1 at a concentration of, e.g., about $10^{14}$ atoms/cm$^2$.

Since impurity ions of $BF_2$ have a mass greater than that of an impurity such as B (boron) (mass of $BF_2$: 49, mass of B: 11), it is difficult to penetrate through the $Si_3N_4$ film 8 and the underlying $SiO_2$ film 3'. Accordingly, even when the $Si_3N_4$ film 8 is made comparatively thin as described above, the impurity is not introduced into the surface of the substrate 1 under the $Si_3N_4$ film 8.

(b) Subsequently, after removing the photoresist film 9, the substrate 1 is annealed at a temperature of, e.g., 1100° C. in an inert gas atmosphere such as nitrogen gas. On the basis of the annealing treatment, the impurity introduced in the surface of the substrate 1 is diffused by drive-in diffusion in accordance with well-known techniques. As a result, the $p^{++}$-type region 7a which is extended into the substrate surface under the $Si_3N_4$ film 8 is formed. After the annealing treatment, using the $Si_3N_4$ film 8 as a mask, $BF_2$ ions are implanted for a second time into the whole surface of the substrate 1 under conditions establishing, for example, 75 keV and $2\times10^{13}$ atoms/cm$^2$. The impurity for forming the $p^+$-type layer 7 as the channel stopper is introduced into the surface of the substrate 1 by the second ion implantation.

The implanting operations of the impurity ions may be altered, if desired, as follows.

First, the $Si_3N_4$ film 8 formed on the $SiO_2$ film 3' is coated with a photoresist film. The photoresist film on the part in which the $p^{++}$-type layer 7a is to be formed is then removed by exposure and developing. Using the remaining photoresist film as a mask, the $Si_3N_4$ film is selectively etched and removed.

Using the remaining $Si_3N_4$ film 8 and the overlying photoresist film as an ion implantation mask, p-type impurity ions are implanted for a first time into the surface of the substrate 1. After removing the photoresist film, the substrate 1 is annealed in the same manner as set forth in the foregoing description.

Next, the whole surface of the substrate is coated with a photoresist film 9 again. The photoresist film 9 is selectively exposed to light and is developed so as to remain on the part of the substrate which is to be made into an active region for the device. Using the remaining photoresist film 9 as an etching mask, the $Si_3N_4$ film 8 is selectively etched and removed. Then, using the remaining photoresist film 9 and $Si_3N_4$ film 8 as an ion implantation mask, p-type impurity ions are implanted for a second time into the surface of the substate 1.

In accordance with this alternative method, in the first ion-implanting operation, that surface of the substrate 1 which is not to be implanted with the ions is covered with the stacked $Si_3N_4$ film 8 and photoresist film. In the second ion-implanting operation, that surface of the substrate 1 which is not to be implanted with the ions, especially the surface which is to be finally made the channel region of the field-effect element, is similarly covered with the stacked $Si_3N_4$ film 8 and photoresist film 9. As a result, it is possible to avoid a problem which can arise if the impurity ions are undesirably introduced into the surface part of the substrate 1 which is to be finally made into the channel region of the field-effect element.

(c) After the second operation of implanting the impurity ions, the substrate 1 is heated at about 1000° C. in, for example, an oxygen atmosphere containing steam. Thus, a comparatively thick field oxide film 2 having a thickness of, e.g., about 1 μm is formed on the surface of the substrate 1. Since, in this case, the $Si_3N_4$ film 8 acts as an oxidation mask, the surface of the substrate 1 covered with the $Si_3N_4$ film 8 is not formed with the field oxide film 2 as seen from FIG. 7(C). In this heat treatment for oxidation, the p-type impurity which has been introduced in the substrate surface by the ion implantation in advance is diffused into the substrate. Accordingly, the $p^{++}$-type region 7a is stretched deep under the field oxide film 2 close to the memory element forming region. A part of the $p^{++}$-type region 7a is extended to the active region (under the $Si_3N_4$ film 8). At the same time, the $p^+$-type region 7 having a concentration suitable for acting as a channel stopper is formed under the field oxide film 2. Since the p-type impurity which is introduced by the second operation of implanting the impurity ions is at the comparatively low concentration as described above, the $p^+$-type region 7 is hardly stretched to the active region.

In accordance with the manufacturing method as stated above, self-alignment between the field $SiO_2$ film 2 and the $p^{++}$-type region 7a is possible, and very accurate and small-sized memory cells can be manufactured at a good yield. In addition, the memory portion and the $Si_3N_4$ film in the peripheral part can be worked at one stroke, so that the deviation of mask alignment need not be considered.

(d) After the field oxidation, the $Si_3N_4$ film 8 is etched and removed by an etching process which uses heated phosphoric acid in accordance with well-known techniques. If necessary, the $SiO_2$ film 3' is removed by a method such as a wash-out method in accordance with known techniques, whereupon the exposed surface of the substrate 1 is formed with a thin $SiO_2$ film (not shown) having a thickness of, e.g., about 400 Å by the thermal oxidation method.

The whole surface of the substrate 1 is then coated again with a photoresist film. The photoresist film is selectively exposed to light and is developed so that the portion which is subsequently to be made into the channel region of the field effect transistor may be exposed.

Using the photoresist film and the field oxide film 2 as an ion implantation mask, As (arsenic) ions as an n-type impurity are implanted into the surface of the substrate 1 under conditions establishing, for example, 150 keV and $3\times10^{12}$ atoms/cm$^2$.

After removing the photoresist film, the thin $SiO_2$ film is removed. The substrate 1 is then heated at, for example, 1000° C. in an oxygen atmosphere, thereby to form a gate $SiO_2$ film 3 being about 500 Å thick on the exposed surface of the substrate 1.

When insulated gate field-effect transistors of comparatively high threshold voltages are required in peripheral circuits of, for example, the 25 volt type, a comparatively thick gate $SiO_2$ film of, e.g., 800 Å is formed by the thermal oxidation before the formation of the gate $SiO_2$ film. It is then subsequently removed selectively from the surface part of the substrate 1. Thereafter, the comparatively thin gate $SiO_2$ film can be formed.

After forming the gate $SiO_2$ film, boron ions given energy of, e.g., 70 keV can be introduced into the substrate surface through the gate $SiO_2$ film 3 if it is necessary to control the threshold voltage of an enhancement mode transistor to a desired value by way of example.

Figure 7D:
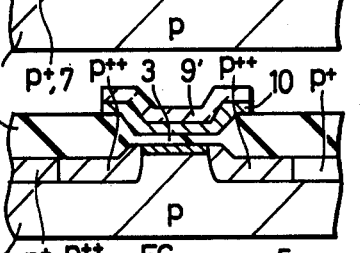
Figure 7D:
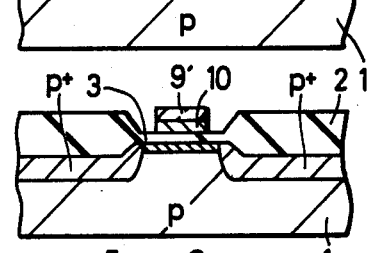

After forming the gate $SiO_2$ film 3, a polycrystalline Si layer 10 having a thickness of about 3500 Å is formed on the surface of the substrate 1 by the CVD (Chemical Vapor Deposition) process in accordance with well-known techniques in order to form the floating gate electrode of the memory transistor, the gate electrode of the peripheral transistor and the required wiring layer. Subsequently, a photoresist film 9' is formed on the polycrystalline Si layer 10, and the photoresist film 9' is selectively exposed to light and is developed. Using the remaining photoresist film 9' as a mask, the polycrystalline Si layer 10 is selectively etched (patterned) as shown in FIG. 7(D), thereby to form the floating gate FG of the memory transistor, the gate electrode G of the peripheral transistor and the necessary wiring.

(e) After removing the photoresist film 9', P (phosphorus) ions are implanted into the polycrystalline Si layer by the ion implantation method. Thus, the polycrystalline Si layer, which is to serve as the gate electrodes FG and G and the wiring, is turned into n-type material and is given a low resistance characteristic.

Figure 7E:
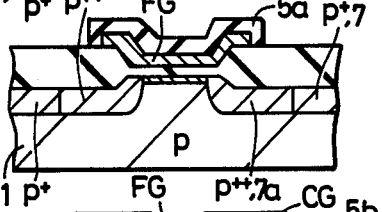
Figure 7E:
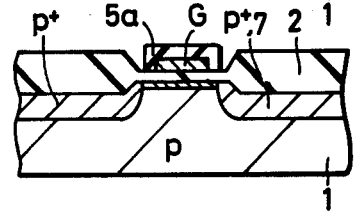

Thereafter, the substrate 1 is heated in an oxidizing atmosphere so as to form an SiO$_2$ film 5a being about 800 Å thick on the surface of each of the gate electrodes FG and G and the wiring layer as illustrated in FIG. 7(E).

The SiO$_2$ films 5a function as an intermediate insulating film.

(f) On the substrate surface subjected to the above step (e), the second layer of polycrystalline Si layer CG being about 3500 Å thick is formed by the CVD process. Subsequently, phosphorus is introduced into the surface of the second layer of polycrystalline Si layer CG as a conductivity type determining impurity by an appropriate impurity deposition method.

Thereafter, a photoresist film is formed on the surface of the substrate 1. Although the present invention is not restricted thereto, the width of the floating gate FG in the memory element can be made equal to that of the control gate CG in this embodiment. To this end, the photoresist film is selectively exposed to light and is developed so as to determine the patterns of the control gates and word lines in the memory array portion. Accordingly, except for the part which is to form the memory array, the photoresist film is left substantially whole by the exposure and developing. After the exposure and developing, using the remaining photoresist film as an etching mask, the second layer of polycrystalline Si layer is selectively etched and removed.

Using the remaining polycrystalline Si layer CG as a mask, the SiO$_2$ films 5a on the surface of the first layer of polycrystalline Si layer FG are etched and removed. Subsequently, using the second layer of polycrystalline Si layer CG and the SiO$_2$ films 5a as a mask, the first layer of polycrystalline Si layer FG is etched and removed. By this etching, the first layer of polycrystalline Si layer FG has its width determined by the width of the second layer of polycrystalline Si layer CG.

After removing the photoresist film, a new photoresist film is formed on the surface of the substrate 1. This new photoresist film is selectively exposed to light and is developed in a pattern in which the unnecessary parts of the second layer of polycrystalline Si layer which overlie the gate electrodes of the insulated gate field-effect transistors constituting the peripheral circuits are removed.

The second layer of polycrystalline Si layer is also utilized to form the second gate electrodes in stacked gate type transistors constituting the peripheral circuits. Accordingly, the new photoresist film is also left on parts to be made into the second gate electrodes of such stacked gate type transistors.

Using the photoresist film as an etching mask, the second layer of polycrystalline Si layer is selectively etched and removed. Subsequently, the photoresist film is removed. At the stage at which the photoresist film has been removed, only the comparatively thin SiO$_2$ film is left on the surface parts of the substrate 1 not covered with the field oxide film 2 and the first and second layers of polycrystalline Si layers, i.e., the surface parts which are to form the source and drain regions of the transistors and the surface parts to form the semiconductor wiring regions.

If necessary, the comparatively thin SiO$_2$ film is removed by an etching method such as a wash-out method in accordance with known techniques. Subsequently, an SiO$_2$ film which is about 350 Å thick is formed on the exposed surface of the substrate 1 by a thermal oxidation method in accordance with known techniques. The SiO$_2$ film is also formed on the exposed surfaces of the first and second layers of polycrystalline Si layers by the thermal oxidation method.

Subsequently, using the field oxide film 2 and the polycrystalline Si layers as an ion implantation mask, the phosphorus ions are introduced into the surface of the substrate 1 so as to establish, for example, a depth of 1 $\mu$m, and a concentration of $10^{16}$ atoms/cm$^2$. As a result, the n-type source and drain regions of the transistors and the semiconductor wiring regions are formed in the surface of the substrate 1.

Figure 7F:
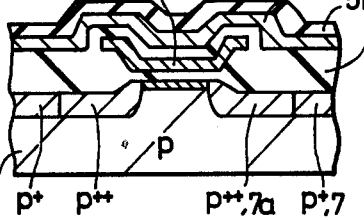
Figure 7F:
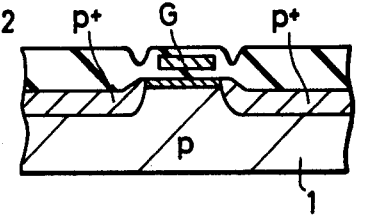

At the next step, if necessary, the substrate 1 is heated at a comparatively low temperature of, e.g., 800° C. in, e.g., an oxidation atmosphere, thereby to form the insulating films 5b on the exposed surfaces of the polycrystalline Si layers. The structure thus far obtained is shown in FIG. 7(F).

Thereafter, using as a mask a photoresist film for leading out electrodes, the SiO$_2$ film on the source and drain regions is selectively etched and removed. After removing the photoresist film, a PSG (phosphosilicate glass) film being, e.g., about 8000 Å thick is subsequently formed on the substrate surface. Using a photoresist film as a mask, the PSG film is selectively etched to form contact holes.

After removing the photoresist film, Al (aluminum) is evaporated on the substrate, and the Al layer is patterned to form a wiring layer. The aluminum wiring 6 is shown in, for example, FIGS. 6(B) and 6(C).

In the non-volatile memory element of the above construction, the p$^{++}$-type region 7a lies in contact with the drain region 4$_D$, so that the pn-junction breakdown takes place under a comparatively low write-down voltage. Accordingly, the write-down voltage to be applied to the bit line must be limited to a comparatively low value.

When one selected bit line, for example, the bit line B$_1$ in FIG. 2(A), is supplied with a write-down voltage exceeding the drain breakdown voltage of the memory element, the drain junctions of the plurality of memory elements F$_{11}$–F$_{2561}$ belonging to the bit line B$_1$ undergo avalanche breakdown, respectively. When the avalanche breakdown has occurred in this manner, holes generated by the avalanche breakdown are injected into the floating gates of the memory elements, and the rewrite-down efficiency deteriorates.

In accordance with another aspect of this invention, the write-down voltage to be applied to the drain of the memory element is formed by the constant voltage diode which has a breakdown voltage substantially equal to the breakdown voltage of the drain junction of the memory element. The constant voltage diode is formed on a single semiconductor substrate by the integrated circuit producing technology together with the transistors for constructing a plurality of memory elements and peripheral circuits. In particular, the constant voltage diode is formed in an appropriate part of the peripheral portion of the semiconductor chip so that the carriers injected into the substrate by the breakdown operation of its junction will not adversely affect the memory elements.

Figure 8A:
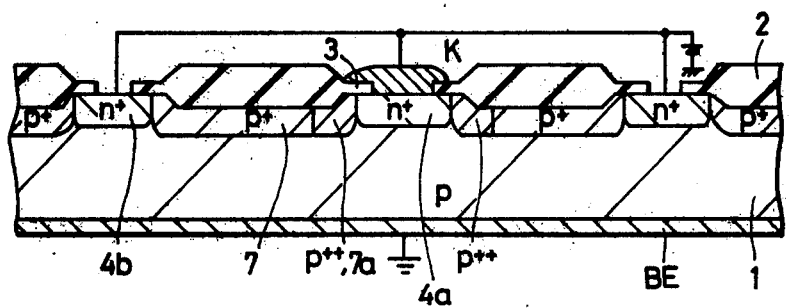

Thus, in accordance with this invention, a constant voltage diode of an appropriate structure can be formed on the semiconductor substrate together with the memory elements. FIG. 8(A) shows a sectional view of such a constant voltage diode, while FIG. 8(B) shows a plan view thereof.

Figure 8B:
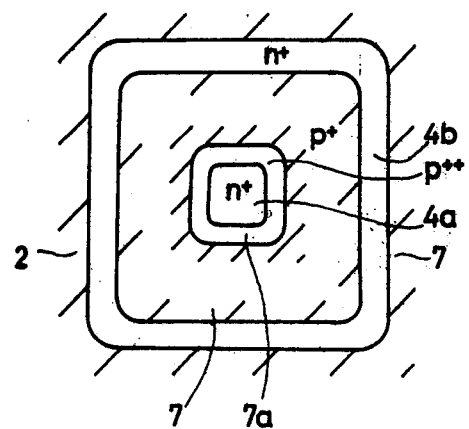
FIG. 8(B) shows a plan view corresponding to FIG. 8(A)

As shown in FIGS. 8(A) and 8(B), the constant voltage diode is constructed of an n+-type semiconductor region $4a$ and a p++-type region $7a$. An electrode and wiring K such as an evaporated aluminum layer is held in non-rectifying contact with the n+-type semiconductor region $4a$ as the cathode of the diode through an opening hole portion provided in an $SiO_2$ film 3. Although not illustrated, the wiring K is extended onto a field oxide film 2 and is connected with the sources of the transistors $Q_{51}$, etc. as shown in FIG. 2(B).

Although no special restriction is intended thereby to the present invention, an electrode BE such as of gold is shown disposed on the lower surface side of the semiconductor substrate 1. The anode electrode of the constant voltage diode is formed by this electrode BE.

The semiconductor region $7a$ is formed simultaneously with the p++-type region $7a$ in FIGS. 6(A) to 6(C) and FIG. 7, while the semiconductor region $4a$ is similarly formed simultaneously with the source and drain regions $4_{S1}$, $4_{S2}$ and $4_D$ of the non-volatile memory elements.

In FIGS. 8(A) and 8(B), an n+-type region $4b$ is formed in a manner to surround the n+-type region $4a$ so that the carriers injected into the substrate 1 by the operation of the constant voltage diode will not exert any undesirable effect on the non-volatile memory elements. The carriers injected into the substrate 1 have difficulty in spreading outside the n+-type region $4b$ so that any such undesirable effect can be avoided.

In the drawing, the n+-type region $4b$ is shown as being maintained at a predetermined potential of the circuitry. The n+-type region $4b$, however, may well be held at the level of the power source voltage $V_{CC}$ of the circuitry.

In accordance with this embodiment, the p++-n+ junction in the non-volatile memory element and the p++-n+ junction of the Zener diode ZD are formed by the same manufacturing step, so that the breakdown voltages of both the junctions equalize following the dispersion of the manufacturing process. It is therefore possible to attain a clamp voltage for accurately preventing an avalanche breakdown in the non-volatile memory element.

As shown in FIG. 2(B), the write-down circuit is of the type wherein the output MISFET $Q_{52}$, etc. disposed on the high voltage side are controlled by the logic circuit which operates under the low voltage $V_{CC}$. Therefore, the write-down circuit can also have a simple circuit arrangement and be low in power dissipation.

Figure 9A:
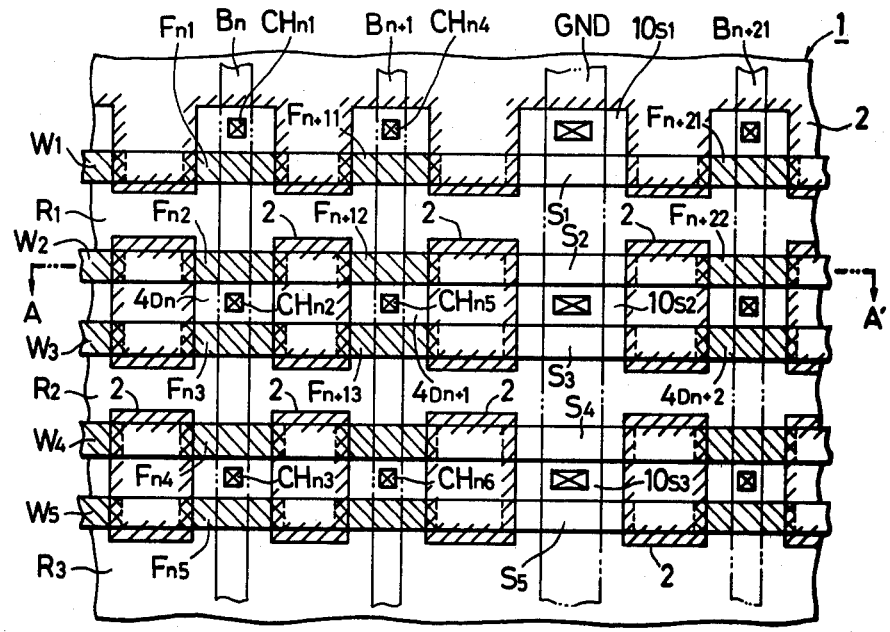
Figure 9B:
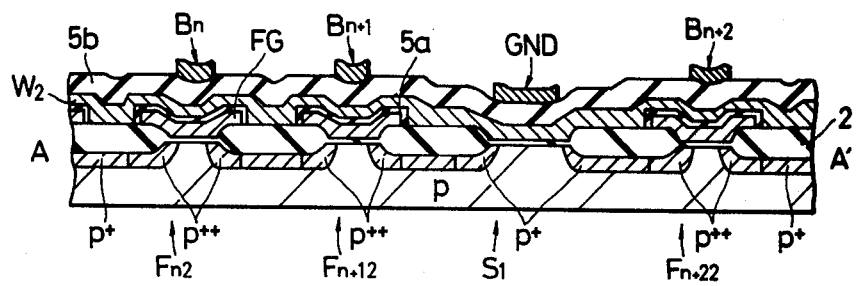
FIG. 9(B) shows a view of one section in FIG. 9(A).

FIG. 9(A) shows a pattern diagram of a memory array such as shown in FIG. 2(A), while FIG. 9(B) shows a structural sectional view taken along part A—A' in FIG. 9(A).

Referring to FIG. 9(A), a field oxide film 2 in a pattern indicated by the combination of oblique lines rising rightward and solid lines is formed on the surface of a p-type semiconductor substrate 1. Word lines $W_1$ to $W_5$ made of polycrystalline silicon layers are also extended on the surface of the substrate 1 in the lateral direction of the drawing. Predetermined parts of the word lines $W_1$ to $W_5$ form the control gates of semiconductor non-volatile memory elements $F_{n1}$ to $F_{n+21}$, $F_{n2}$ to $F_{n+22}$, and $F_{n3}$ to $F_{n+23}$, respectively.

Floating gates as apparent from FIGS. 6(A) to 6(C) and FIGS. 7(A) to 7(F) are arranged under the control gates. In FIG. 9(A), the pattern of the floating gate is indicated by the combination of broken lines and oblique lines falling rightward.

In that surface of the substrate 1 which is not covered with the field oxide film 2 and the word lines $W_1$ to $W_5$, n+-type semiconductor regions to be used as the source and drain regions of the semiconductor non-volatile memory elements and semiconductor wiring regions are formed.

A semiconductor region $R_1$ which is located between the word lines $W_1$ and $W_2$, and which is extended in parallel with these word lines $W_1$ and $W_2$, is used as the common source region of the memory elements $F_{n1}$ to $F_{n+21}$ and $F_{n2}$ to $F_{n+22}$. The semiconductor region $R_1$ constructs the reference potential line $R_1$ as shown in FIG. 2(A).

The semiconductor substrate 1 is overlaid with a plurality of conductor layers $B_n$ to $B_{n+21}$ which are made of, e.g., aluminum layers and which are extended in the vertical direction in the drawing. These conductor layers construct bit lines, respectively.

The respective conductor layers are connected with the drain regions of the memory elements through contact holes. By way of example, the conductor layer $B_n$ is connected with the drain regions of the memory elements $F_{n1}$, $F_{n2}$, $F_{n3}$, $F_{n4}$, $F_{n5}$, etc. through the contact holes $CH_{n1}$, $CH_{n2}$ and $CH_{n3}$.

In the memory array of FIG. 9(A), a plurality of switching MISFETs $S_1$ to $S_5$ are constructed together with the plurality of memory elements. By way of example, the switching MISFET $S_1$ is constructed of a source region $10_{S1}$, the word line $W_1$ and the semiconductor region $R_1$, and the switching MISFET $S_2$ is constructed of the semiconductor region $R_1$, the word line $W_2$ and a source region $10_{S2}$. Further, the switching element $S_3$ is constructed of the source region $10_{S2}$, the word line $W_3$ and a semiconductor region $R_2$. The switching MISFETs, for example, $S_2$ and $S_3$ belonging to one set of word line $W_2$ and $W_3$ have their source regions made common.

The drains of the switching MISFETs are constructed of the semiconductor regions $R_1$, $R_2$, $R_3$, etc. The sources of the switching MISFETs are connected to a ground line GND through contact holes. The ground line GND can be formed in parallel with the bit lines, and can be made of the aluminum wiring layers similarly to the bit lines. Accordingly, the gates of the switching MISFETs can be formed by the patterning step of the word lines, and the ground line for the switching MISFETs by the patterning step of the bit lines.

The semiconductor regions constituting the switching MISFETs can be formed without spoiling the regularity of the pattern of the memory array. Therefore, this embodiment has the advantage that the switching MISFETs can be inserted in any desired parts of the memory array portion. Moreover, the density of integration is not spoiled thereby.

These semiconductor devices can be formed by the semiconductor manufacturing method described before. The reason why such switching MISFETs are disposed in the memory array portion is to prevent the channel leakage currents as stated previously. Therefore, the switching MISFETs of this embodiment are not provided with regions such as p++-type regions for high speed write-down which are disposed in the substrate surface in the channel direction of the memory elements. The switching MISFETs preventive of the channel leakage currents as stated above can also be extensively applied to EPROMs which employ memory elements provided with no p++-type region.

It is to be understood that the above-described arrangements are simply illustrative of the application of the principles of this invention. Numerous other arrangements may be readily devised by those skilled in the art which embody the principles of the invention and fall within its spirit and scope.

We claim:

1. In an electrically programmable read only memory comprising:
   a first plurality of non-volatile memory elements each including a source, a drain and a control gate, the gates of which are commonly connected to a first word line,
   the improvement comprising:
   a first switch MISFET, at least one of source electrodes of said first plurality of said non-volatile memory elements being connected to a reference potential through a drain-source path of said first switch MISFET, a gate electrode of said first switch MISFET being connected to said first word line.

2. An electrically programmable read only memory according to claim 1, wherein said source electrodes of said first plurality of said non-volatile memory elements are commonly connected to said reference potential through said drain-source path of said first switch MISFET.

3. An electrically programmable read only memory according to claim 2, further comprising:
   a second plurality of non-volatile memory elements each including a source, a drain and a control gate, the control gates of which are commonly connected to a second word line; and
   a second switch MISFET, wherein source electrodes of said second plurality of said non-volatile memory elements are commonly connected to said reference potential through a drain-source path of said second switch MISFET, a gate electrode of said second switch MISFET being connected to said second word line, and said source electrodes of the first and the second plurality of non-volatile memory elements and drain electrodes of said first and said second switch MISFET being connected commonly to one another.

4. An electrically programmable read only memory according to claim 3, wherein said reference potential is ground potential.

5. An electrically programmable read only memory according to claim 1 or 3, wherein each of said non-volatile memory elements includes a floating gate.

6. An electrically programmable read only memory according to claim 3, further comprising a plurality of bit lines each of which is coupled to the drain of a memory element from said first plurality of memory elements and to the drain of a memory element from said second plurality of memory elements to form a plurality of respective pairs of memory elements each coupled to a respective bit line.

7. An electrically programmable read only memory according to claim 6, wherein said plurality of bit lines are each coupled to a write-down circuit for providing a write-down voltage to the drains of said respective pairs of memory elements coupled along selected bit lines.

8. An electrically programmable read only memory according to claim 7, wherein each said non-volatile memory element includes a floating gate, and further wherein said write-down circuit includes a pn-junction element having a junction which is similar to the drain junction of the non-volatile memory element so that the level of a write-down voltage to be applied to the drain of the non-volatile memory element is determined in accordance with a breakdown voltage of the pn-junction element.

9. An electrically programmable read only memory according to claim 8, wherein the write-down voltage is substantially equal to the breakdown voltage of the PN junction device.

10. In an electrically programmable read only memory comprising a non-volatile memory element which has a floating gate electrode and a control gate electrode,
    the improvement comprising:
    a write-down circuit coupled to said memory element to apply a write-down voltage to a drain of said memory element, said write-down circuit including a pn-junction element having a junction which is similar to the drain junction of the non-volatile memory element so that the level of a write-down voltage to be applied to the drain of the non-volatile memory element is determined in accordance with a breakdown voltage of the pn-junction element.

11. An electrically programmable read only memory as defined in claim 10, wherein said non-volatile memory element includes in a portion of its channel region a semiconductor region which has the same conductivity type as that of a semiconductor substrate in which said memory element is formed, said portion having a higher impurity concentration than said substrate.

12. An electrically programmable read only memory as defined in claim 11, wherein said pn-junction element is constructed of semiconductor regions which are respectively formed simultaneously with said high concentration portion and a drain region of said non-volatile memory element.

13. An electrically programmable read only memory as defined in claim 12, further comprising:
    a level-shift MISFET; and
    an output MISFET, the voltage generated by the pn-junction element being applied to a gate electrode of the output MISFET through the level-shift MISFET, wherein the write-down voltage is obtained from the source electrode of the output MISFET.

14. An electrically programmable read only memory as defined in claim 13, wherein the level-shift MISFET is an enhancement mode MISFET, and wherein a gate electrode and a drain electrode of the level-shift MISFET are connected with each other.

15. An electrically programmable read only memory as defined in claim 10, wherein said write-down voltage is substantially equal to the breakdown voltage of the PN junction device.

* * * * *